(12) United States Patent
Kang et al.

(10) Patent No.: US 10,437,272 B2
(45) Date of Patent: Oct. 8, 2019

(54) POWER SUPPLY CIRCUIT AND RELATED METHODS FOR GENERATING A POWER SUPPLY VOLTAGE IN A SEMICONDUCTOR PACKAGE

(71) Applicant: Samsung Electronics Co., Ltd., Suwon-si, Gyeonggi-do (KR)

(72) Inventors: Hee-Won Kang, Hwaseong-si (KR); In-Hyuk Go, Suwon-si (KR); Nam-Su Kim, Suwon-si (KR); Eun-Ji Moon, Suwon-si (KR); Jae-Sang Yun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/935,114

(22) Filed: Mar. 26, 2018

(65) Prior Publication Data

US 2019/0072991 A1 Mar. 7, 2019

(30) Foreign Application Priority Data

Sep. 1, 2017 (KR) .................. 10-2017-0111986

(51) Int. Cl.
*G05F 1/46* (2006.01)
*H01L 25/065* (2006.01)
(Continued)

(52) U.S. Cl.
CPC .............. *G05F 1/465* (2013.01); *G05F 1/462* (2013.01); *G05F 1/565* (2013.01); *G11C 5/14* (2013.01);
(Continued)

(58) Field of Classification Search
CPC . G05F 1/462; G05F 1/56; G05F 1/565; G11C 5/14; G11C 5/143; G11C 5/147;
(Continued)

(56) References Cited

U.S. PATENT DOCUMENTS 5,998,242 A 12/1999 Kirkpatrick et al.
8,399,305 B2 3/2013 Huang et al.
(Continued)

FOREIGN PATENT DOCUMENTS

KR 10-0258878 3/2000

*Primary Examiner* — Fred E Finch, III
(74) *Attorney, Agent, or Firm* — Myers Bigel, P.A.

(57) ABSTRACT

A power supply circuit includes a first comparator, a second comparator, a first voltage regulator, an output terminal, a first path and a second path. The first comparator compares a first input voltage with a first reference voltage to generate a first control signal. The second comparator compares a second input voltage with the first reference voltage to generate a second control signal. A voltage level of the second input voltage is different from a voltage level of the first input voltage. The first voltage regulator is selectively enabled based on the first control signal and the second control signal, and generates a first voltage based on the first input voltage. A voltage level of the first voltage is substantially the same as the voltage level of the second input voltage. The output terminal is configured to output one of the second input voltage and the first voltage as a power supply voltage. The first path directly provides the first input voltage to the first voltage regulator. The second path directly provides the second input voltage to the output terminal. The second input voltage bypasses the first voltage.

20 Claims, 11 Drawing Sheets

(51) Int. Cl.
- *G11C 5/14* (2006.01)
- *G05F 1/565* (2006.01)
- *H01L 23/538* (2006.01)
- *H01L 23/00* (2006.01)
- *H01L 23/31* (2006.01)
- *G11C 16/30* (2006.01)
- *H01L 25/18* (2006.01)

(52) U.S. Cl.
CPC .............. *G11C 5/143* (2013.01); *G11C 5/147* (2013.01); *H01L 23/538* (2013.01); *H01L 24/49* (2013.01); *H01L 25/0655* (2013.01); *H01L 25/0657* (2013.01); *G11C 16/30* (2013.01); *H01L 23/3128* (2013.01); *H01L 24/29* (2013.01); *H01L 24/32* (2013.01); *H01L 24/48* (2013.01); *H01L 24/73* (2013.01); *H01L 25/18* (2013.01); *H01L 2224/04042* (2013.01); *H01L 2224/2919* (2013.01); *H01L 2224/32145* (2013.01); *H01L 2224/32225* (2013.01); *H01L 2224/48091* (2013.01); *H01L 2224/48145* (2013.01); *H01L 2224/48225* (2013.01); *H01L 2224/48227* (2013.01); *H01L 2224/49052* (2013.01); *H01L 2224/73265* (2013.01); *H01L 2225/0651* (2013.01); *H01L 2225/06506* (2013.01); *H01L 2225/06562* (2013.01); *H01L 2225/06586* (2013.01); *H01L 2924/1427* (2013.01); *H01L 2924/1434* (2013.01); *H01L 2924/15182* (2013.01); *H01L 2924/15192* (2013.01); *H01L 2924/15311* (2013.01)

(58) Field of Classification Search
CPC .............. H01L 23/538; H01L 25/0655; H01L 25/0657; H01L 24/48; H01L 2224/48225; H01L 2225/06506; H01L 2225/0651; H01L 2924/1438; H01L 2924/1427
See application file for complete search history.

(56) References Cited

U.S. PATENT DOCUMENTS

| | | |
|---|---|---|
| 8,947,131 B2 | 2/2015 | Lee |
| 9,099,927 B2 | 8/2015 | Choi |
| 9,412,717 B2 | 8/2016 | Chen et al. |
| 2004/0241262 A1 | 12/2004 | Huey et al. |
| 2007/0147157 A1* | 6/2007 | Luo ................. G11C 5/143 365/226 |
| 2008/0049533 A1* | 2/2008 | Seo ................. G11C 5/14 365/226 |
| 2008/0080255 A1* | 4/2008 | Kagan .............. G11C 5/147 365/185.23 |
| 2008/0137444 A1* | 6/2008 | Mair ................ G11C 5/143 365/189.07 |
| 2010/0135097 A1* | 6/2010 | Berke ............... G11C 5/04 365/226 |
| 2010/0255641 A1 | 10/2010 | Nakanishi et al. |
| 2011/0228622 A1* | 9/2011 | Coteus ............. G11C 5/147 365/226 |
| 2011/0300673 A1 | 12/2011 | Mercado et al. |
| 2015/0047187 A1 | 2/2015 | Hung |
| 2015/0078059 A1* | 3/2015 | Knoedgen ......... G11C 17/16 365/94 |
| 2017/0102754 A1* | 4/2017 | Chi ................. G11C 5/147 |

* cited by examiner

FIG. 4A

|  | CS1 | CS2 | VOLTAGE REGULATOR |
|---|---|---|---|
| CASE1 | 0 | 1 | DISABLE |
| CASE2 | 1 | 0 | ENABLE |
| CASE3-1 | 1 | 1 | DISABLE |

FIG. 4B

|  | CS1 | CS2 | VOLTAGE REGULATOR |
|---|---|---|---|
| CASE1 | 0 | 1 | DISABLE |
| CASE2 | 1 | 0 | ENABLE |
| CASE3-2 | 1 | 1 | ENABLE |

POWER SUPPLY CIRCUIT AND RELATED METHODS FOR GENERATING A POWER SUPPLY VOLTAGE IN A SEMICONDUCTOR PACKAGE

CROSS-REFERENCE TO RELATED APPLICATION

This application claims priority under 35 U.S.C § 119 to Korean Patent Application No. 10-2017-0111986, filed on Sep. 1, 2017 in the Korean Intellectual Property Office (KIPO), the contents of which are herein incorporated in its entirety by reference.

FIELD OF THE INVENTION

Example embodiments relate generally to semiconductor integrated circuits, and more particularly to power supply circuits, semiconductor packages including the power supply circuits, and methods of generating power supply voltages.

BACKGROUND

Semiconductor integrated circuits operate based on at least one power supply voltage. For example, the semiconductor integrated circuits may directly use an external voltage that is provided from an external circuit as the power supply voltage, or may include a power supply circuit that generates the power supply voltage based on the external voltage. The power supply voltage should be stable for driving the semiconductor integrated circuits. Researchers are conducting various research projects on techniques of designing power supply circuits that output a power supply voltage having a fixed level, regardless of different input voltages having different levels.

SUMMARY

Some embodiments of the present disclosure provide a power supply circuit for efficiently generating a power supply voltage having a fixed voltage level when at least one of two or more different input voltages is received.

Some embodiments of the present disclosure provides a semiconductor package including the power supply circuit and having backward compatibility.

Some embodiments of the present disclosure provide methods of efficiently generating a power supply voltage having a fixed voltage level when at least one of two or more different input voltages is received.

According to some embodiments, a power supply circuit includes a first comparator, a second comparator, a first voltage regulator, an output terminal, a first path and a second path. The first comparator compares a first input voltage with a first reference voltage to generate a first control signal. The second comparator compares a second input voltage with the first reference voltage to generate a second control signal. A voltage level of the second input voltage is different from a voltage level of the first input voltage. The first voltage regulator is selectively enabled based on the first control signal and the second control signal, and generates a first voltage based on the first input voltage. A voltage level of the first voltage is substantially the same as the voltage level of the second input voltage. The output terminal is configured to output one of the second input voltage and the first voltage from the first voltage regulator as a power supply voltage. The first path directly provides the first input voltage to the first voltage regulator. The second path directly provides the second input voltage to the output terminal. The second input voltage bypasses the first voltage regulator.

According to some embodiments, a semiconductor package includes a base substrate, a first semiconductor chip and a second semiconductor chip. The first semiconductor chip is disposed on the base substrate, and includes a power supply circuit configured to generate a power supply voltage based on at least one of a first input voltage and a second input voltage that are provided from an external device and have different voltage levels. The second semiconductor chip is disposed on the base substrate, and operates based on the power supply voltage received from the first semiconductor chip. The power supply circuit includes a first comparator, a second comparator, a first voltage regulator, an output terminal, a first path and a second path. The first comparator compares the first input voltage with a first reference voltage to generate a first control signal. The second comparator compares the second input voltage with the first reference voltage to generate a second control signal. The first voltage regulator is selectively enabled based on the first control signal and the second control signal, and generates a first voltage based on the first input voltage. A voltage level of the first voltage is substantially the same as the voltage level of the second input voltage. The output terminal outputs one of the second input voltage and the first voltage as the power supply voltage. The first path directly provides the first input voltage to the first voltage regulator. The second path directly provides the second input voltage to the output terminal. The second input voltage bypasses the first voltage regulator.

According to some embodiments, in a method of generating a power supply voltage, it is checked whether a first input voltage and a second input voltage are received. A voltage level of the second input voltage is different from a voltage level of the first input voltage. When the first input voltage is received, a first voltage is output as the power supply voltage via an output terminal by enabling a first path and a first voltage regulator and by generating the first voltage based on the first input voltage. The first path directly provides the first input voltage to the first voltage regulator. A voltage level of the first voltage is substantially the same as the voltage level of the second input voltage. When the second input voltage is received, the second input voltage is output as the power supply voltage via the output terminal by disabling the first voltage regulator and by enabling a second path. The second path directly provides the second input voltage to the output terminal. The second input voltage bypasses the first voltage regulator.

According to some embodiments, a semiconductor package includes a base substrate, a first semiconductor chip and a second semiconductor chip. The first semiconductor chip is disposed on the base substrate, and includes a power supply circuit configured to generate a power supply voltage based on at least one of a first input voltage and a second input voltage that are provided from an external device and have different voltage levels. The second semiconductor chip is disposed on the base substrate, and operates based on one voltage level of the power supply voltage and the first input voltage which is provided from the external device. The power supply circuit includes a comparator and a voltage regulator. The base substrate has a wire which delivers the voltage level of the second input voltage to the second semiconductor chip. The voltage level of the second input voltage is an operation voltage of the second semiconductor chip.

The power supply circuit according to some embodiments may generate the power supply voltage having the fixed voltage level regardless of input voltages in an environment where at least one of two or more input voltages having different voltage levels is received or supplied. One input voltage may be directly provided to the output terminal by bypassing the voltage regulator, and the other input voltages may be converted by the voltage regulator and may be provided to the output terminal In addition, the path for bypassing the input voltage may be formed by directly connecting the input terminal with the output terminal without any additional configuration such as a switch. Accordingly, the power supply circuit may have a relatively simple structure and may efficiently generate the power supply voltage having the fixed voltage level.

The semiconductor package according to some embodiments may include the power supply circuit. Even if a voltage level of a power supply voltage that is used in a semiconductor package is changed, both a semiconductor package using the changed power supply voltage and a semiconductor package using the unchanged power supply voltage may be manufactured based on a single type of base substrate, without using different types of base substrate. Accordingly, the semiconductor package may have the backward compatibility, and the cost for developing and manufacturing the semiconductor package may be reduced.

BRIEF DESCRIPTION OF THE DRAWINGS

Illustrative, non-limiting example embodiments will be more clearly understood from the following detailed description taken in conjunction with the accompanying drawings.

FIGS. 2, 3, 4A and 4B are diagrams for describing an operation of the power supply circuit, according to some embodiments of the present inventive concept.

DETAILED DESCRIPTION OF THE EMBODIMENTS

Figure 1:
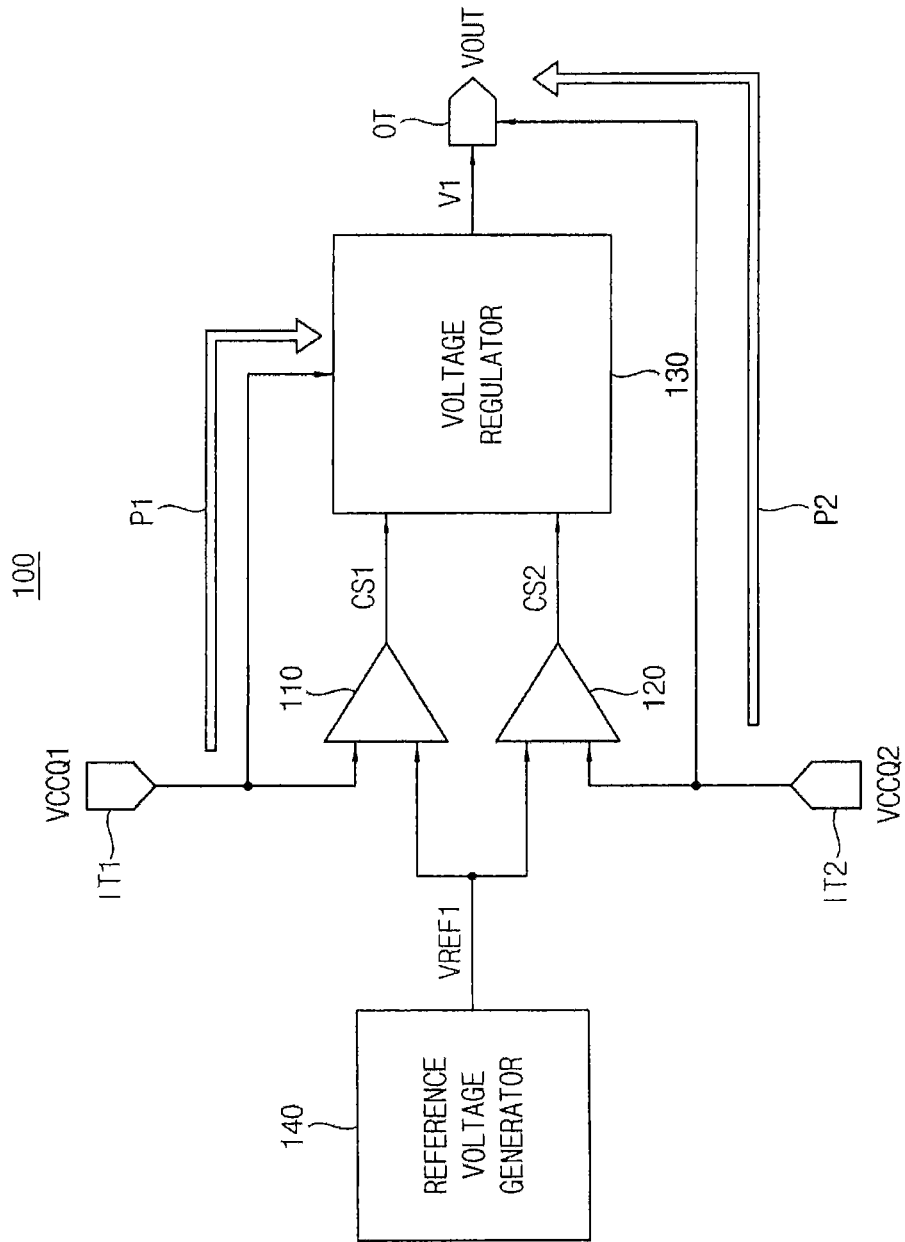
FIG. 1 is a block diagram illustrating a power supply circuit, according to some embodiments of the present inventive concept.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

Various example embodiments will be described more fully with reference to the accompanying drawings, in which some embodiments are shown. The present disclosure may, however, be embodied in many different forms and should not be construed as limited to the embodiments set forth herein. Like reference numerals refer to like elements throughout this application.

Semiconductor integrated circuits operate based on at least one power supply voltage. For example, the semiconductor integrated circuits may directly use an external voltage that is provided from an external circuit as the power supply voltage, or may include a power supply circuit that generates the power supply voltage based on the external voltage. The power supply voltage should be stable for driving the semiconductor integrated circuits. A single power supply voltage may be provided to a memory block in a package. As the specification of Universal Flash Storage (UFS) is upgraded from UFS 2.0 to UFS 3.0, the power supply voltage may be decreased, for example from 1.8V to 1.2V. Thus, a Printed Circuit Board (PCB) supporting a UFS 3.0 package may need to support a different power supply voltage than for a UFS 2.0 package. It may not be desirable to develop and manage different types of PCBs and/or different types of packages for UFS 2.0 vs. UFS 3.0.

Various embodiments described herein arise from the recognition that a power supply circuit is needed that is capable of supporting the power supply voltage requirements for both UFS2.0 and UFS3.0. A power supply voltage may be generated that has fixed voltage levels regardless of input voltages when two input voltages having different voltage levels are received or supplied. Even if a level of a power supply voltage that is used in a semiconductor package is changed, both a semiconductor package using the changed power supply voltage and a semiconductor package using the unchanged power supply voltage may be manufactured based on a single type of base substrate such as, for example, a PCB. Accordingly, the semiconductor package may provide backward compatibility, and the cost for developing and manufacturing the semiconductor package may be reduced.

FIG. 1 is a block diagram illustrating a power supply circuit according to some embodiments.

Referring to FIG. 1, a power supply circuit 100 includes a first comparator 110, a second comparator 120, a first voltage regulator 130, an output terminal OT, a first path P1 and a second path P2. The power supply circuit 100 may include a first input terminal IT1, a second input terminal IT2 and a reference voltage generator 140.

The first input terminal IT1 may receive a first input voltage VCCQ1. The second input terminal IT2 may receive a second input voltage VCCQ2. A voltage level of the second input voltage VCCQ2 is different from a voltage level of the first input voltage VCCQ1.

The first comparator 110 compares the first input voltage VCCQ1 with a first reference voltage VREF1 to generate a first control signal CS1. The second comparator 120 compares the second input voltage VCCQ2 with the first reference voltage VREF1 to generate a second control signal CS2.

The first voltage regulator 130 is selectively enabled based on the first control signal CS1 and the second control signal CS2. The first voltage regulator 130 generates a first voltage V1 based on the first input voltage VCCQ1. A voltage level of the first voltage V1 is substantially the same as the voltage level of the second input voltage VCCQ2. In some embodiments, the first input voltage may be a Universal Flash Storage (UFS) 2.0 voltage and the second input voltage may be a UFS 3.0 voltage.

The first path P1 directly provides the first input voltage VCCQ1 to the first voltage regulator 130. For example, the first path P1 may directly connect the first input terminal IT1 receiving the first input voltage VCCQ1 with the first voltage regulator 130.

The second path P2 directly provides the second input voltage VCCQ2 to the output terminal OT, and thus the second input voltage VCCQ2 bypasses the first voltage regulator 130. For example, the second path P2 may directly connect the second input terminal IT2 receiving the second input voltage VCCQ2 with the output terminal OT. In other words, the second input terminal IT2 and the output terminal OT may be formed of a shorted connection by the second path P2.

The output terminal OT outputs one of the second input voltage VCCQ2 and the first voltage V1 as a power supply voltage VOUT. As will be described with reference to FIGS. 2, 3, 4A and 4B, the power supply voltage VOUT may always have a fixed voltage level (e.g., a voltage level that is substantially the same as the voltage level of the second input voltage VCCQ2), and one of the first path P1 and the second path P2 may be used to output the power supply voltage VOUT.

The first voltage regulator 140 may generate the first reference voltage VREF1. The first reference voltage VREF1 may be used to check whether the first input voltage VCCQ1 and the second input voltage VCCQ2 are received or not. In other words, VREF1 may be used to check for an input at IT1 and/or IT2.

FIGS. 2, 3, 4A and 4B are diagrams for describing an operation of the power supply circuit according to example embodiments.

Figure 2:
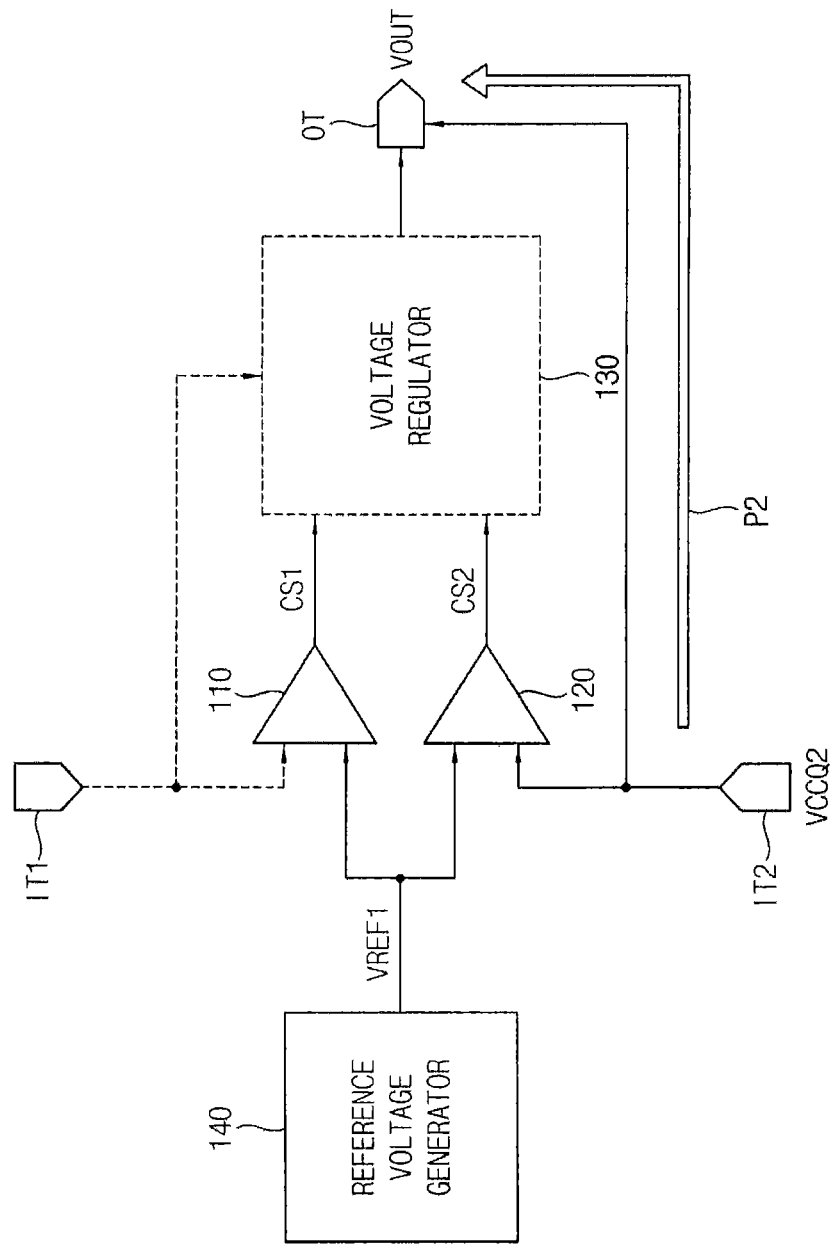

Referring to FIG. 2, the first input voltage VCCQ1 may not be received, supplied or provided from an external device (not illustrated) at IT1, and the second input voltage VCCQ2 may be received, supplied or provided from the external device via the second input terminal IT2. Thus, the first path P1 in FIG. 1 may be disabled. In FIG. 2, the disabled first path may be illustrated by a dotted line.

Since the first input voltage VCCQ1 is not received, a voltage at the first input terminal IT1 may be about zero volts. The first comparator 110 may compare the voltage at the first input terminal IT1 (e.g., 0V) with the first reference voltage VREF1, and may generate the first control signal CS1 representing that the first input voltage VCCQ1 is not received. For example, when the first control signal CS1 has a first logic level (e.g., "0"), it may be represented that the first input voltage VCCQ1 is not received. When the first control signal CS1 has a second logic level (e.g., "1"), it may be represented that the first input voltage VCCQ1 is received.

Since the second input voltage VCCQ2 is received, the second comparator 120 may compare a voltage at the second input terminal IT2 (e.g., the second input voltage VCCQ2) with the first reference voltage VREF1, and may generate the second control signal CS2 representing that the second input voltage VCCQ2 is received. As with the first control signal CS1, when the second control signal CS2 has the first logic level, it may be represented that the second input voltage VCCQ2 is not received. When the second control signal CS2 has the second logic level, it may be represented that the second input voltage VCCQ2 is received.

In some example embodiments, the voltage level of the second input voltage VCCQ2 may be lower than the voltage level of the first input voltage VCCQ1. For example, the voltage level of the first input voltage VCCQ1 may be about 1.8V, and the voltage level of the second input voltage VCCQ2 may be about 1.2V. In this example, a level of the first reference voltage VREF1 may be lower than the level of the first input voltage VCCQ1 and may be higher than the level of the second input voltage VCCQ2 (e.g., VCCQ2<VREF1<VCCQ1).

As described above, if the first input voltage VCCQ1 is not received and the second input voltage VCCQ2 is received, the first control signal CS1 may have the first logic level and the second control signal CS2 may have the second logic level based on the operations of the first comparator 110 and the second comparator 120. In this non-limiting example, the first voltage regulator 130 may be disabled based on the first control signal CS1 and the second control signal CS2. In FIG. 2, the disabled first voltage regulator may be illustrated by a dotted line. The check for the first input voltage VCCQ1 and/or the second input voltage VCCQ2 being received may be performed at the comparators 110, 120 and/or by the voltage regulator 130.

Since the second input voltage VCCQ2 is received, the second path P2 may be enabled. In this example, the second input voltage VCCQ2 may be directly provided to the output terminal OT via the second path P2, and thus the second input voltage VCCQ2 may be output as the power supply voltage VOUT. For example, the voltage level of the power supply voltage VOUT may be about 1.2V, which is substantially the same as the voltage level of the second input voltage VCCQ2.

Figure 3:
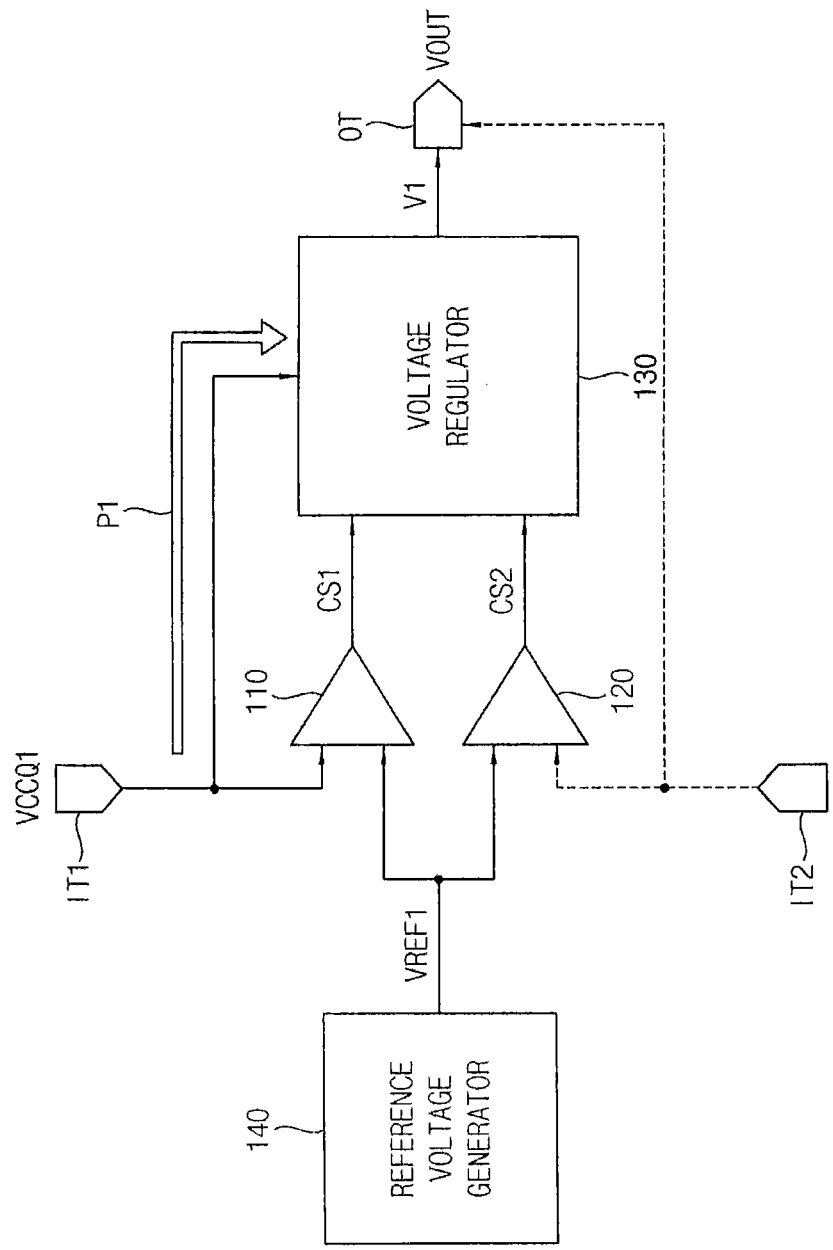

Referring to FIG. 3, the second input voltage VCCQ2 may not be received, supplied or provided from the external device at IT2, and the first input voltage VCCQ1 may be received, supplied or provided from the external device via the first input terminal IT1. Thus, the second path P2 in FIG. 1 may be disabled. In FIG. 3, the disabled second path may be illustrated by a dotted line.

Since the first input voltage VCCQ1 is received, the first comparator 110 may compare a voltage at the first input terminal IT1 (e.g., the first input voltage VCCQ1) with the first reference voltage VREF1, and may generate the first control signal CS1 representing that the first input voltage VCCQ1 is received.

Since the second input voltage VCCQ2 is not received, a voltage at the second input terminal IT2 may be about zero volts. The second comparator 120 may compare the voltage at the second input terminal IT2 (e.g., 0V) with the first reference voltage VREF1, and may generate the second control signal CS2 representing that the second input voltage VCCQ2 is not received.

As described above, if the second input voltage VCCQ2 is not received and the first input voltage VCCQ1 is received, the first control signal CS1 may have the second logic level and the second control signal CS2 may have the first logic level based on the operations of the first comparator 110 and the second comparator 120. In this non-limiting example, the first voltage regulator 130 may be enabled based on the first control signal CS1 and the second control signal CS2.

Since the first input voltage VCCQ1 is received, the first path P1 may be enabled. In this example, the first input voltage VCCQ1 may be directly provided to the first voltage regulator 130 via the first path P1, the first voltage regulator 130 may generate the first voltage V1 based on the first input voltage VCCQ1, and thus the first voltage V1 may be output as the power supply voltage VOUT.

In some example embodiments, the voltage level of the first voltage V1 may be substantially the same as the voltage level of the second input voltage VCCQ2, and thus the voltage level of the first voltage V1 may be lower than the voltage level of the first input voltage VCCQ1. For example, the level of the first voltage V1 may be about 1.2V, which is substantially the same as the level of the second input voltage VCCQ2, and thus the voltage level of the power supply voltage VOUT may also be about 1.2V.

In some example embodiments, the first voltage regulator 130 may be a low dropout (LDO) regulator that converts the first input voltage VCCQ1 having a relatively high voltage level into the first voltage V1 having a relatively low voltage level.

As described with reference to FIGS. 2 and 3, if only one of the first input voltage VCCQ1 and the second input voltage VCCQ2 is received, supplied or provided to IT1 or IT2, the power supply circuit 100 may generate the power supply voltage VOUT having the fixed voltage level based on one of the first path P1 and the second path P2. As illustrated in FIG. 2, if the second input voltage VCCQ2 is received and the first input voltage VCCQ1 is not received, the first path P1 and the first voltage regulator 130 may be disabled, the second path P2 may be enabled, and the second input voltage VCCQ2 may be output as the power supply voltage VOUT via the second path P2 and the output terminal OT. As illustrated in FIG. 3, if the first input voltage VCCQ1 is received and the second input voltage VCCQ2 is not received, the second path P2 may be disabled, the first path P1 and the first voltage regulator 130 may be enabled to generate the first voltage V1 based on the first input voltage VCCQ1, and the first voltage V1 may be output as the power supply voltage VOUT via the output terminal OT.

Although example embodiments are described based on an example where it is checked whether the first input voltage VCCQ1 and the second input voltage VCCQ2 are received based on a single reference voltage (e.g., the first reference voltage VREF1), the presence of the first input voltage VCCQ1 and the second input voltage VCCQ2 may be checked based on two different reference voltages.

Referring to FIGS. 4A and 4B, even if both the first input voltage VCCQ1 and the second input voltage VCCQ2 are received, the power supply circuit 100 may generate the power supply voltage VOUT having the fixed voltage level. In this example, it may be predetermined whether the power supply voltage VOUT is generated based on the second path P2 (e.g., an example illustrated in FIG. 2) or based on the first path P1 and the first voltage regulator 130 (e.g., an example illustrated in FIG. 3).

In some example embodiments, as illustrated in FIG. 4A, if both the first input voltage VCCQ1 and the second input voltage VCCQ2 are received (CASE3-1), both the first control signal CS1 and the second control signal CS2 may have the second logic level based on the operations of the first comparator 110 and the second comparator 120. In this example, it may be set to disable the first voltage regulator 130 based on the first control signal CS1 and the second control signal CS2 having the second logic level, and thus the second input voltage VCCQ2 may be output as the power supply voltage VOUT via the second path P2 and the output terminal OT.

In some example embodiments, as illustrated in FIG. 4B, if both the first input voltage VCCQ1 and the second input voltage VCCQ2 are received (CASE3-2), both the first control signal CS1 and the second control signal CS2 may have the second logic level based on the operations of the first comparator 110 and the second comparator 120. In this example, it may be set to enable the first voltage regulator 130 based on the first control signal CS1 and the second control signal CS2 having the second logic level, the first voltage regulator 130 may generate the first voltage V1 based on the first input voltage VCCQ1 provided via the first path P1, and thus the first voltage V1 may be output as the power supply voltage VOUT via the output terminal OT.

In some example embodiments, the power supply circuit 100 may be set to have one of an example of FIG. 4A and an example of FIG. 4B by an engineer's and/or user's setting, a user's environment, etc. For example, when the power consumption is to be reduced, the first voltage regulator 130 may be disabled based on the example of FIG. 4A. In some embodiments, when the power supply voltage VOUT is to be stably provided, the first voltage regulator 130 may be enabled based on the example of FIG. 4B.

In the examples of FIGS. 4A and 4B, in a case where the second input voltage VCCQ2 is received and the first input voltage VCCQ1 is not received (CASE1), and in a case where the first input voltage VCCQ1 is received and the second input voltage VCCQ2 is not received (CASE2), the logic levels of the first and second control signals CS1 and CS2 and the operation of the first voltage regulator 130 may be substantially the same as the examples described with reference to FIGS. 2 and 3, and thus repeated descriptions will be omitted.

In some example embodiments, one of a table of FIG. 4A and a table of FIG. 4B may be stored in the first voltage regulator 130, and the first voltage regulator 130 may be selectively enabled based on information in the tables of FIG. 4A or 4B and the control signals CS1 and/or CS2.

The power supply circuit 100 according to example embodiments may generate the power supply voltage VOUT having the fixed voltage level regardless of input voltages in an environment where at least one of two input voltages VCCQ1 and VCCQ2 having different levels is received or supplied. One input voltage (e.g., the second input voltage VCCQ2) may be directly provided to the output terminal OT by bypassing the first voltage regulator 130, and another input voltage (e.g., the first input voltage VCCQ1) may be converted by the first voltage regulator 130 and may be provided to the output terminal OT. In addition, the path P2 for bypassing the input voltage VCCQ2 may be formed by directly connecting the input terminal IT2 with the output terminal OT without any additional configuration such as a switch. Accordingly, the power supply circuit 100 may have a relatively simple structure and may efficiently generate the power supply voltage VOUT having the fixed voltage level (e.g., the voltage level that is substantially the same as the voltage level of the input voltage VCCQ2).

Figure 5A:
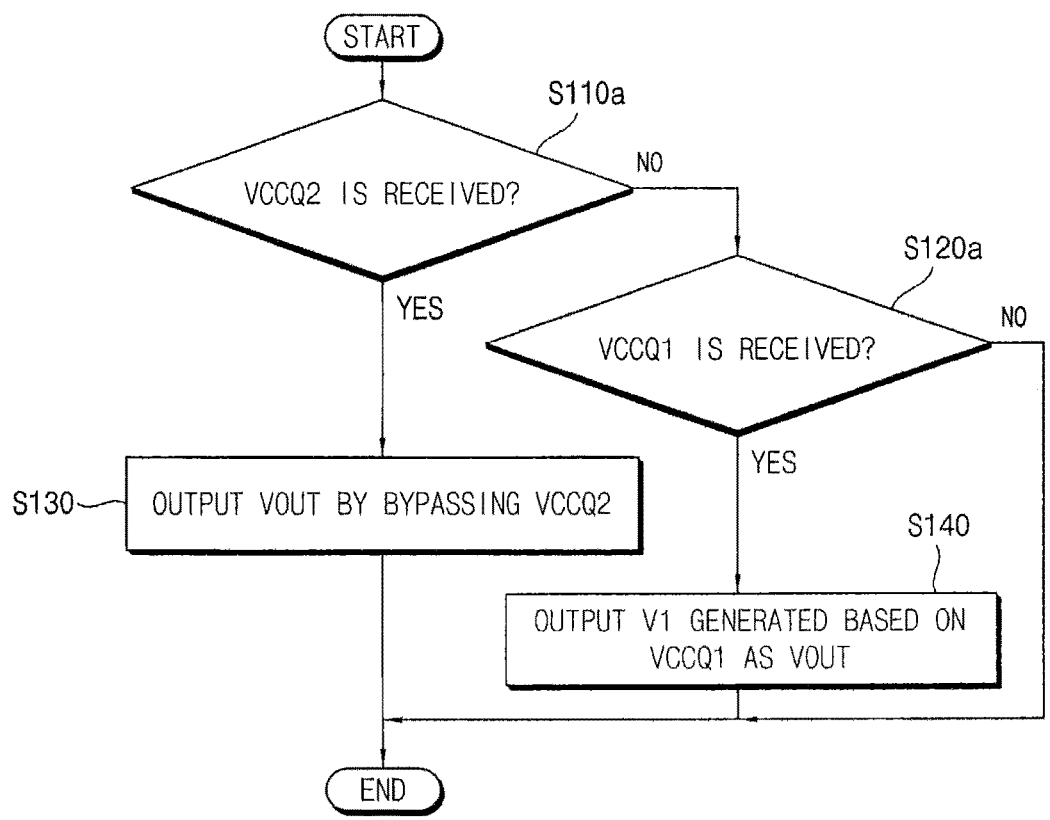
FIGS. 5A and 5B are flow charts illustrating a method of generating a power supply voltage, according to some embodiments of the present inventive concept.
Figure 5B:
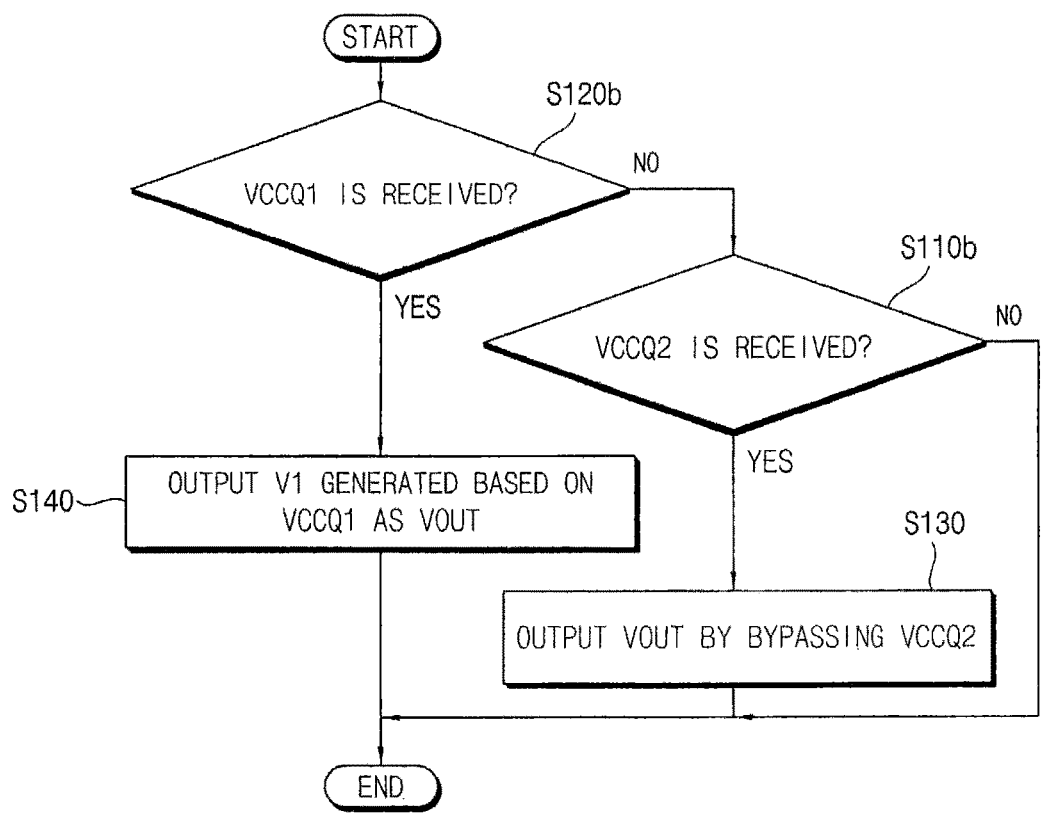

FIGS. 5A and 5B are flow charts illustrating a method of generating a power supply voltage according to example embodiments.

Referring to FIG. 5A, in a method of generating a power supply voltage according to example embodiments, it may be checked first whether the second input voltage VCCQ2 is received or not (block S110a). A check may then be performed as to whether the first input voltage VCCQ1 is received or not (block S120a). Blocks S120a and S120b may be reversed in some embodiments.

If the second input voltage VCCQ2 is received (block S110a: YES), the second path P2 may be enabled, and the power supply voltage VOUT may be output by bypassing the second input voltage VCCQ2 (block S130). In other words, as illustrated in FIG. 2, the second input voltage VCCQ2 may be directly provided to the output terminal OT via the second path P2, and thus the second input voltage VCCQ2 may be output as the power supply voltage VOUT. The first path P1 and the first voltage regulator 130 may be disabled.

If the second input voltage VCCQ2 is not received (block S110a: NO), and if the first input voltage VCCQ1 is received (block S120a: YES), the first path P1 and the first voltage regulator 130 may be enabled, and the first voltage V1 that is generated based on the first input voltage VCCQ1 may be output as the power supply voltage VOUT (Block S140). In other words, as illustrated in FIG. 3, the first input voltage VCCQ1 may be directly provided to the first voltage regulator 130 via the first path P1, the first voltage regulator 130 may generate the first voltage V1 based on the first input voltage VCCQ1, and thus the first voltage V1 may be output as the power supply voltage VOUT. The second path P2 may be disabled.

If both the first input voltage VCCQ1 and the second input voltage VCCQ2 are not received (block S110a: NO and block S120a: NO), the power supply voltage VOUT may not be generated.

In an example of FIG. 5A, since it is checked first whether the second input voltage VCCQ2 is received, the power supply voltage VOUT may be output by bypassing the second input voltage VCCQ2 based on blocks S110a and S130 if both the first input voltage VCCQ1 and the second input voltage VCCQ2 are received. In other words, the example of FIG. 5A may correspond to the example of FIG. 4A.

Referring to FIG. 5B, in a method of generating a power supply voltage according to example embodiments, it may be checked first whether the first input voltage VCCQ1 is received or not (block S120b), after which it may be then checked whether the second input voltage VCCQ2 is received or not (block S110b).

An example of FIG. 5B may be substantially the same as the example of FIG. 5A, except that an order of block S120b and S110b in FIG. 5B is different from an order of block S110a and S120a in FIG. 5A, and thus repeated descriptions will be omitted.

In the example of FIG. 5B, since it is checked first whether the first input voltage VCCQ1 is received, the first voltage V1 that is generated based on the first input voltage VCCQ1 may be output as the power supply voltage VOUT based on blocks S120b and S140 if both the first input voltage VCCQ1 and the second input voltage VCCQ2 are received. In other words, the example of FIG. 5B may correspond to the example of FIG. 4B.

Figure 6:
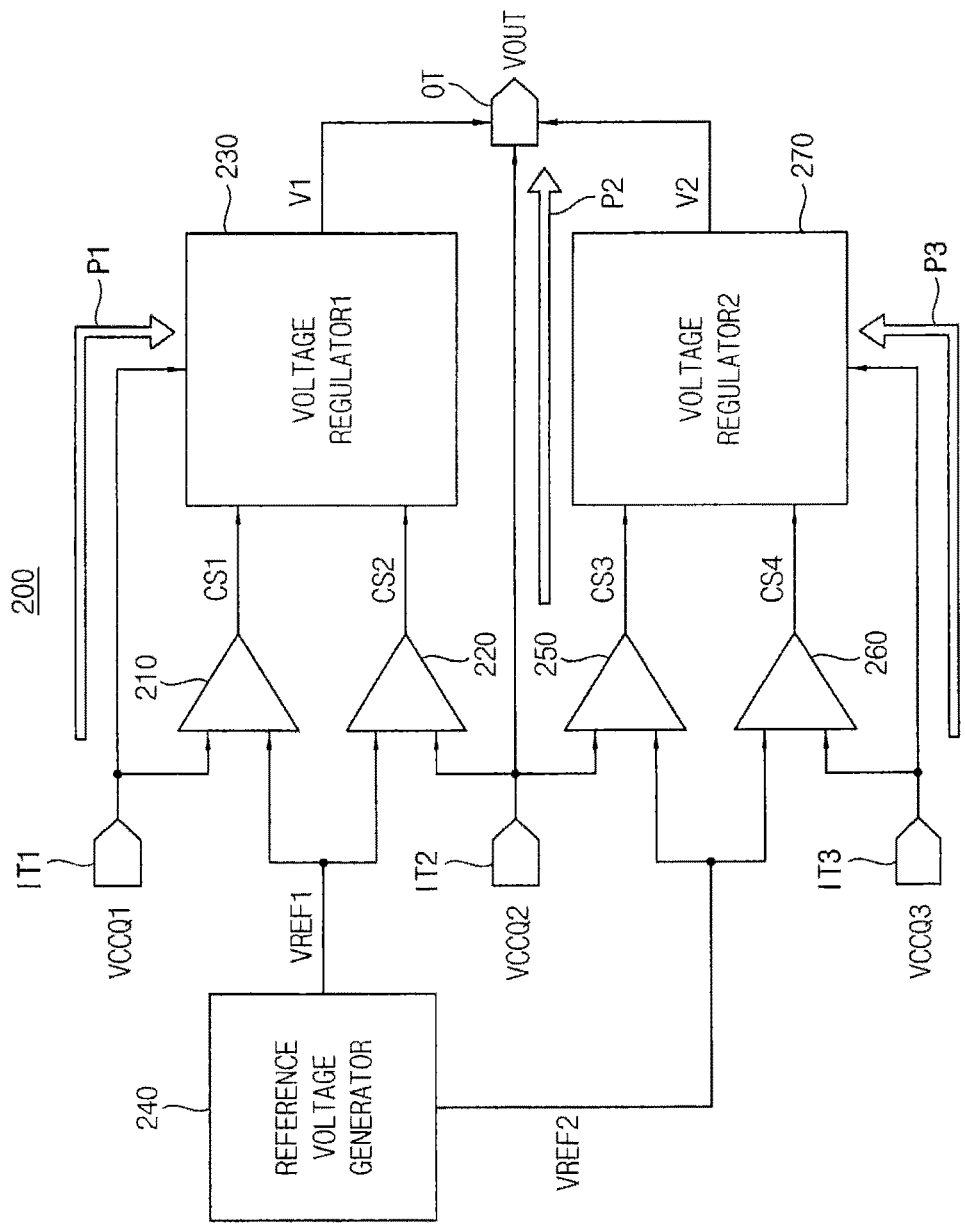
FIG. 6 is a block diagram illustrating a power supply circuit, according to some embodiments of the present inventive concept.

FIG. 6 is a block diagram illustrating a power supply circuit according to example embodiments.

Referring to FIG. 6, a power supply circuit 200 includes a first comparator 210, a second comparator 220, a first voltage regulator 230, an output terminal OT, a first path P1 and a second path P2. The power supply circuit 200 may further include a first input terminal IT1, a second input terminal IT2, a third input terminal IT3, a reference voltage generator 240, a third comparator 250, a fourth comparator 260, a second voltage regulator 270 and a third path P3.

The first comparator 210, the second comparator 220, the first voltage regulator 230, the first path P1, the second path P2, the first input terminal IT1 and the second input terminal IT2 in FIG. 6 may be substantially the same as the first comparator 110, the second comparator 120, the first voltage regulator 130, the first path P1, the second path P2, the first input terminal IT1 and the second input terminal IT2 in FIG. 1, respectively. The reference voltage generator 240 in FIG. 6 may be substantially the same as the reference voltage generator 140 in FIG. 1, except that the reference voltage generator 240 further generates a second reference voltage VREF2. Thus, repeated descriptions will be omitted.

The third input terminal IT3 may receive a third input voltage VCCQ3. A voltage level of the third input voltage VCCQ3 may be different from the voltage level of the first input voltage VCCQ1 and the voltage level of the second input voltage VCCQ2.

The third comparator 250 may compare the second input voltage VCCQ2 with the second reference voltage VREF2 to generate a third control signal CS3. The fourth comparator 260 may compare the third input voltage VCCQ3 with the second reference voltage VREF2 to generate a fourth control signal CS4. The second reference voltage VREF2 may be used to check whether the second input voltage VCCQ2 and the third input voltage VCCQ3 are received or not.

The second voltage regulator 270 may be selectively enabled based on the third control signal CS3 and the fourth control signal CS4, and may generate a second voltage V2 based on the third input voltage VCCQ3. A voltage level of the second voltage V2 may be substantially the same as the voltage level of the second input voltage VCCQ2. The third path P3 may directly provide the third input voltage VCCQ3 to the second voltage regulator 270.

The output terminal OT may output one of the second input voltage VCCQ2, the first voltage V1 or the second voltage V2 as the power supply voltage VOUT. The power supply voltage VOUT may always have a fixed level (e.g., the voltage level that is substantially the same as the level of the second input voltage VCCQ2), and one of the first path P1, the second path P2 and the third path P3 may be used to output the power supply voltage VOUT.

Although not illustrated in detail, operations of the third comparator 250, the fourth comparator 260, the second voltage regulator 270, the second path P2 and the third path P3 may be substantially the same as the operations of the first comparator 110, the second comparator 120, the first voltage regulator 130, the first path P1 and the second path P2 that are described with reference to FIGS. 2, 3, 4A and 4B.

The power supply circuit 200 according to example embodiments may generate the power supply voltage VOUT having a fixed voltage level regardless of input voltages in an environment where at least one of three input voltages VCCQ1, VCCQ2 and VCCQ3 having different levels is received or supplied. One input voltage (e.g., the second input voltage VCCQ2) may be directly provided to the output terminal OT by bypassing the voltage regulators 230 and 270, and the other input voltages (e.g., the first and third input voltages VCCQ1 and VCCQ3) may be converted by the voltage regulators 230 and 270 and may be provided to the output terminal OT. In addition, the path P2 for bypassing the input voltage VCCQ2 may be formed by directly connecting the input terminal IT2 with the output terminal OT without any additional configuration such as a switch. Accordingly, the power supply circuit 200 may have a relatively simple structure and may efficiently generate the power supply voltage VOUT having a fixed level.

Although example embodiments are described based on two input voltages VCCQ1 and VCCQ2 or three input voltages VCCQ1, VCCQ2 and VCCQ3, the power supply circuit and the method of generating the power supply voltage according to example embodiments may be adopted in an environment where at least one of a plurality of input voltages (e.g., two or more or any number of input voltages) having different levels is received or supplied.

Figure 7:
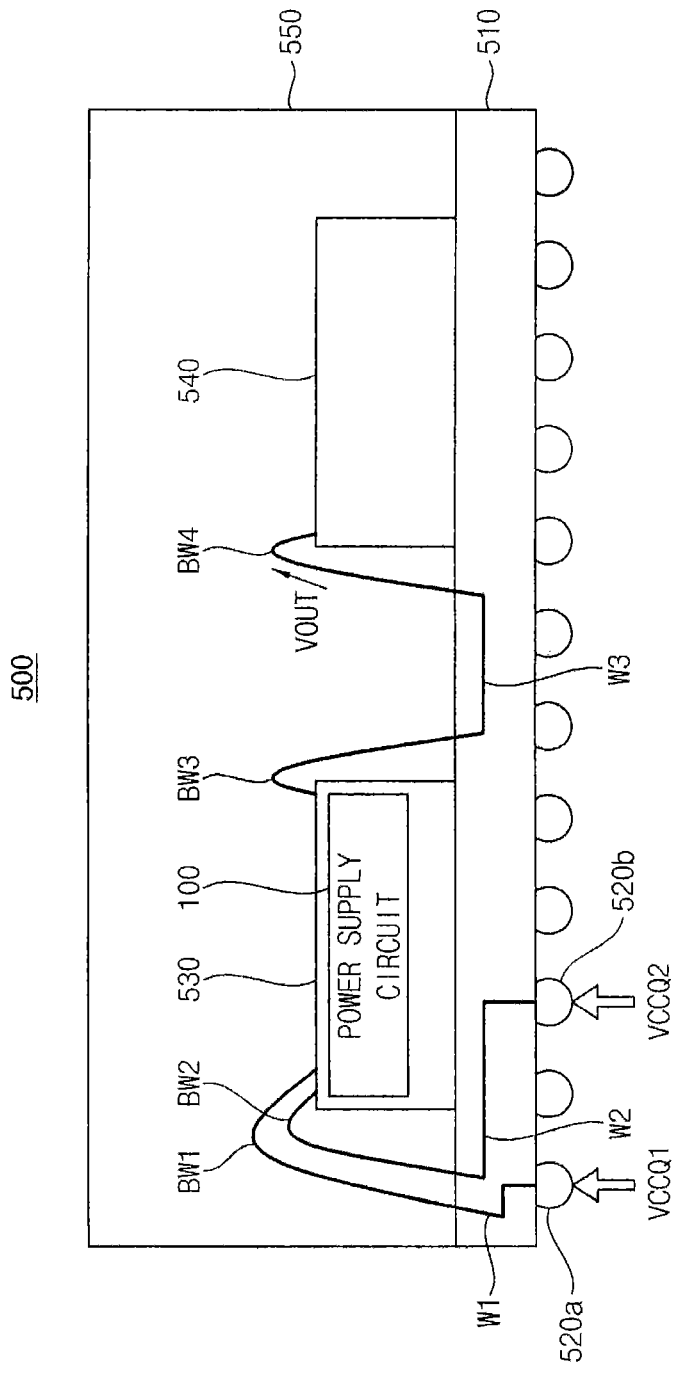
FIGS. 7, 8 and 9 are cross-sectional views illustrating a semiconductor package, according to some embodiments of the present inventive concept.
Figure 8:
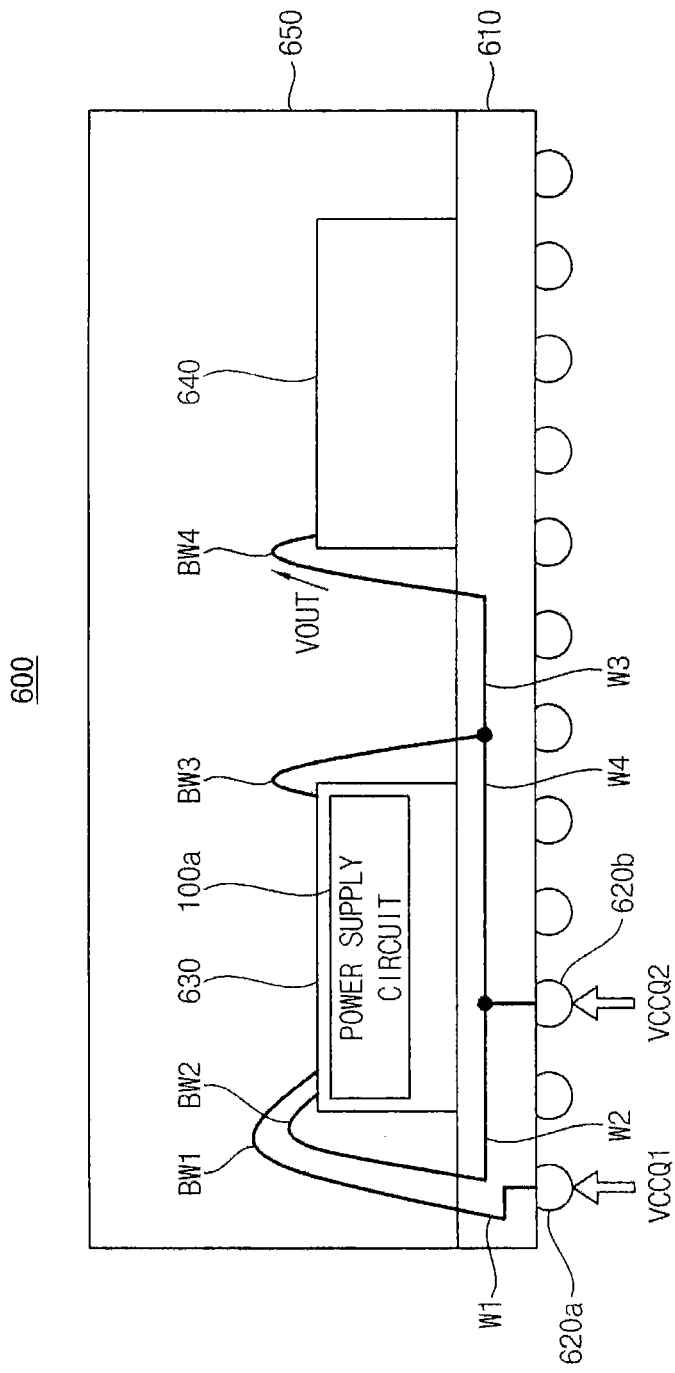
Figure 9:
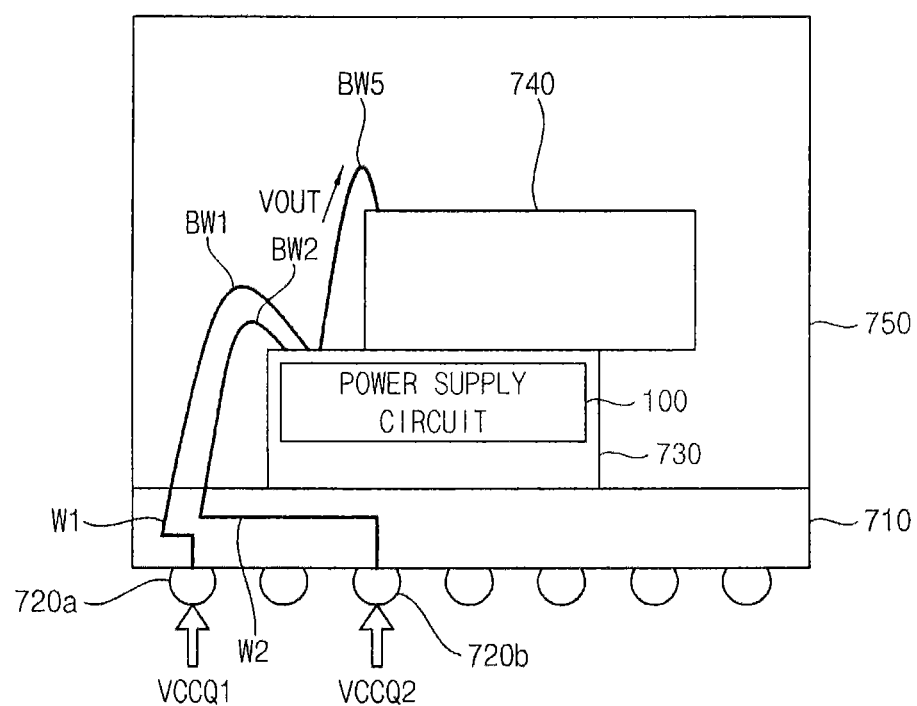

FIGS. 7, 8 and 9 are cross-sectional views illustrating a semiconductor package according to example embodiments.

Referring to FIG. 7, a semiconductor package 500 includes a base substrate 510, a first semiconductor chip 530 and a second semiconductor chip 540. The semiconductor package 500 may further include a plurality of conductive bumps such as 520a and 520b, a plurality of wires W1, W2 and W3, a plurality of bonding wires BW1, BW2, BW3 and BW4, and a sealing member 550. The plurality of wires W1, W2 and W3 may be formed in the base substrate 510, and the plurality of bonding wires BW1, BW2, BW3 and BW4 may be formed on the base substrate 510.

The first semiconductor chip 530 is formed or disposed on the base substrate 510, and includes a power supply circuit 100. The power supply circuit 100 may be the power supply circuit according to example embodiments that is described with reference to FIGS. 1 through 6. The power supply circuit 100 generates the power supply voltage VOUT based on at least one of the first and second input voltages VCCQ1 and VCCQ2 that may have different voltage levels and are received from an external device. For example, the first input voltage VCCQ1 may be received by the power supply circuit 100 via the conductive bump 520a, the wire W1 and the bonding wire BW1, and the second input voltage VCCQ2 may be received by the power supply circuit 100 via the conductive bump 520b, the wire W2 and the bonding wire BW2.

The power supply circuit 100 may include the first comparator 110, the second comparator 120, the first voltage regulator 130, the output terminal OT, the first path P1 and the second path P2, and may further include the first input terminal IT1, the second input terminal IT2 and the reference voltage generator 140. One input voltage (e.g., the second input voltage VCCQ2) may be directly provided to the output terminal OT by bypassing the first voltage regulator 130, and another input voltage (e.g., the first input voltage VCCQ1) may be converted by the first voltage regulator 130 and may be provided to the output terminal OT. In addition, the path P2 for bypassing the input voltage VCCQ2 may be formed by directly connecting the input terminal IT2 with the output terminal OT without any additional configuration such as a switch. Accordingly, the power supply circuit 100 may have a relatively simple structure and may efficiently generate the power supply voltage VOUT having a fixed voltage level (e.g., the voltage level that is substantially the same as the voltage level of the input voltage VCCQ2) regardless of the input voltages.

The second semiconductor chip 540 is formed or disposed on the base substrate 510, and operates based on the power supply voltage VOUT that is received from the first semiconductor chip 530 (e.g., from the power supply circuit 100). For example, the second semiconductor chip 540 may receive the power supply voltage VOUT via the bonding wire BW3, the wire W3 and the bonding wire BW4. The second semiconductor chip 540 may be spaced apart from the first semiconductor chip 530.

In some example embodiments, the second path P2 that connects the second input terminal IT2 receiving the second input voltage VCCQ2 with the output terminal OT may be formed in the first semiconductor chip 530. For example, as illustrated in FIG. 1, the second path P2 may be formed in the power supply circuit 100 or any location inside the first semiconductor chip 530.

In some example embodiments, the first semiconductor chip 530 may operate based on electrical signals that are directly received from the external device. The second semiconductor chip 540 may operate based on electrical signals that are received from the first semiconductor chip 530, and may not directly receive the electrical signals from the external device. For example, the second semiconductor chip 540 may be a memory chip including at least one nonvolatile memory device, and the first semiconductor chip 530 may be a controller chip that controls the at least one nonvolatile memory device.

The first semiconductor chip 530, the second semiconductor chip 540 and the plurality of bonding wires BW1, BW2, BW3 and BW4 may be fixed by the sealing member 550. The plurality of conductive bumps 520a and 520b may be disposed on a bottom surface of the base substrate 510 for electrical connections to the external device.

Although not illustrated in FIG. 7, the first semiconductor chip 530 and the second semiconductor chip 540 may further include a plurality of input/output (I/O) pads that are connected to the plurality of bonding wires BW1, BW2, BW3 and BW4.

Referring to FIG. 8, a semiconductor package 600 includes a base substrate 610, a first semiconductor chip 630 and a second semiconductor chip 640, and may further include a plurality of conductive bumps 620a and 620b, a plurality of wires W1, W2, W3 and W4, a plurality of bonding wires BW1, BW2, BW3 and BW4, and a sealing member 650.

The base substrate 610, the first semiconductor chip 630, the second semiconductor chip 640, the plurality of conductive bumps 620a and 620b, the plurality of wires W1, W2 and W3, the plurality of bonding wires BW1, BW2, BW3 and BW4, and the sealing member 650 in FIG. 8 may be substantially the same as the base substrate 510, the first semiconductor chip 530, the second semiconductor chip 540, the plurality of conductive bumps 520a and 520b, the plurality of wires W1, W2 and W3, the plurality of bonding wires BW1, BW2, BW3 and BW4, and the sealing member 550 in FIG. 7, respectively. The semiconductor package 600 of FIG. 8 may be substantially the same as the semiconductor package 500 of FIG. 7, except that the semiconductor package 600 further includes the wire W4 and a structure of a power supply voltage 100a included in the first semiconductor chip 630 may be partially changed. Thus, repeated descriptions will be omitted.

In some example embodiments, the second path P2 that connects the second input terminal IT2 receiving the second input voltage VCCQ2 with the output terminal OT may be formed in the base substrate 610. For example, a path of receiving the second input voltage VCCQ2 that includes the conductive bump 520b, the wire W2 and the bonding wire BW2 and a path of outputting the power supply voltage VOUT that includes the bonding wire BW3, the wire W3 and the bonding wire BW4 may be directly connected to each other by the wire W4 that is formed in the base substrate 610. In this example, different from the power supply circuit 100 of FIG. 1, the second path P2 included in the power supply voltage 100a of the first semiconductor chip 630 may be omitted.

Referring to FIG. 9, a semiconductor package 700 includes a base substrate 710, a first semiconductor chip 730 and a second semiconductor chip 740, and may further include a plurality of conductive bumps 720a and 720b, a plurality of wires W1 and W2, a plurality of bonding wires BW1, BW2 and BW5, and a sealing member 750.

The base substrate 710, the first semiconductor chip 730, the second semiconductor chip 740, the plurality of conductive bumps 720a and 720b, the plurality of wires W1 and W2, the plurality of bonding wires BW1, BW2 and BW5, and the sealing member 750 in FIG. 9 may be substantially the same as the base substrate 510, the first semiconductor chip 530, the second semiconductor chip 540, the plurality of conductive bumps 520a and 520b, the plurality of wires W1 and W2, the plurality of bonding wires BW1, BW2 and BW4, and the sealing member 550 in FIG. 7, respectively. The semiconductor package 700 of FIG. 9 may be substantially the same as the semiconductor package 500 of FIG. 7, except that the second semiconductor chip 740 is formed or disposed on the first semiconductor chip 730. Thus, repeated descriptions will be omitted.

In some example embodiments, the second semiconductor chip 740 may be disposed on the first semiconductor chip 730. For example, the first semiconductor chip 730 and the second semiconductor chip 740 may be stacked scalariformly, that is, in a block shape, such that the plurality of bonding wires BW1, BW2 and BW5 are easily arranged.

Although not illustrated in FIG. 9, an adhesive member may intervene between the first semiconductor chip 730 and the second semiconductor chip 740. Although not illustrated in FIG. 9, the plurality of bonding wires BW1, BW2 and BW5 may be replaced with a plurality of through silicon vias (TSVs).

The semiconductor packages 500, 600 and 700 according to example embodiments may include the power supply voltages 100 and 100a that generate the power supply voltage VOUT having the fixed voltage level regardless of input voltages in an environment where at least one of two input voltages VCCQ1 and VCCQ2 having different voltage levels is received or supplied. Even if a voltage level of a power supply voltage that is used in a semiconductor package is changed, both a semiconductor package using the changed power supply voltage and a semiconductor package using the unchanged power supply voltage may be manufactured based on a single type of base substrate (e.g., a printed circuit board (PCB)), without using different types of base substrate. Accordingly, the semiconductor package may have the backward compatibility, and the cost for developing and manufacturing the semiconductor package may be reduced.

Figure 10:
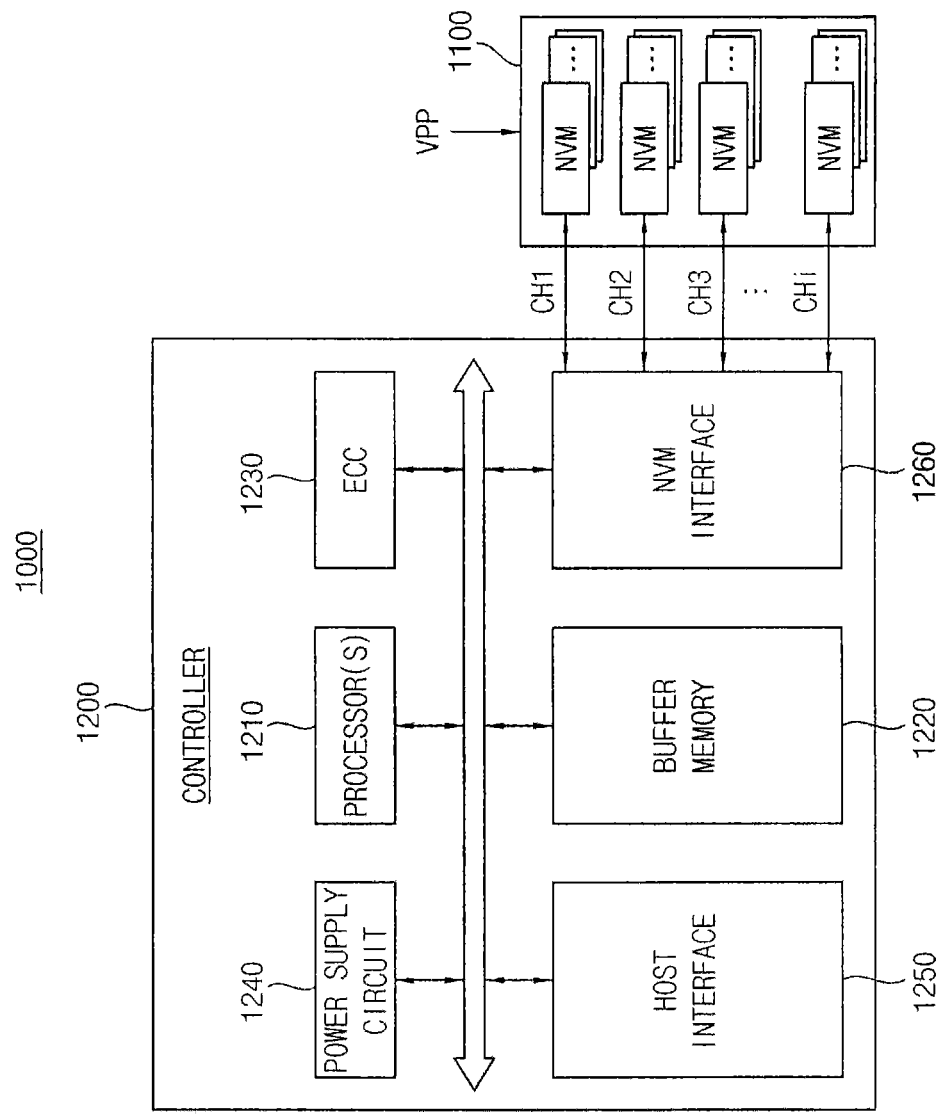
FIG. 10 is a block diagram illustrating a storage device, according to some embodiments of the present inventive concept.

FIG. 10 is a block diagram illustrating a storage device according to example embodiments.

Referring to FIG. 10, a storage device 1000 may include a plurality of nonvolatile memory devices 1100 and a controller 1200. For example, the storage device 1000 may be any storage device such as an embedded multimedia card (eMMC), a universal flash storage (UFS), a solid state disc or solid state drive (SSD), etc.

The controller 1200 may be connected to the nonvolatile memory devices 1100 via a plurality of channels CH1, CH2, CH3 . . . CHi. The controller 1200 may include one or more processors 1210, a buffer memory 1220, an error correction code (ECC) circuit 1230, a power supply circuit 1240, a host interface 1250, and a nonvolatile memory interface 1260.

The buffer memory 1220 may store data used to drive the controller 1200. The ECC circuit 1230 may calculate error correction code values of data to be programmed during a program operation, and may correct an error of read data using an error correction code value during a read operation. In a data recovery operation, the ECC circuit 1230 may correct an error of data recovered from the nonvolatile memory devices 1100. The host interface 1250 may provide an interface with an external device. The nonvolatile memory interface 1260 may provide an interface with the nonvolatile memory devices 1100. The power supply circuit 1240 may be the power supply circuit according to example embodiments.

Each of the nonvolatile memory devices 1100 may be optionally supplied with an external high voltage VPP.

The present disclosure may be applied to various devices and systems that include the power supply circuit, the semiconductor package and the storage device. For example, the present disclosure may be applied to systems such as a mobile phone, a smart phone, a tablet computer, a laptop computer, a personal digital assistants (PDA), a portable multimedia player (PMP), a digital camera, a portable game console, a music player, a camcorder, a video player, a navigation device, a wearable device, an internet of things (IoT) device, an internet of everything (IoE) device, an e-book, a virtual reality (VR) device, an augmented reality (AR) device, and/or a robotic device, etc.

As used herein, the term "and/or" includes any and all combinations of one or more of the associated listed items. Expressions such as "at least one of," when preceding a list of elements, modify the entire list of elements and do not modify the individual elements of the list.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor package comprising:
   a base substrate;
   a first semiconductor chip on the base substrate, the first semiconductor chip comprising a power supply circuit configured to generate a power supply voltage based on at least one of a first input voltage and a second input voltage that are provided from an external device and have different voltage levels; and
   a second semiconductor chip on the base substrate, the second semiconductor chip configured to operate based on the power supply voltage received from the first semiconductor chip,
   wherein the power supply circuit comprises:
   a first comparator configured to compare the first input voltage with a first reference voltage to generate a first control signal;
   a second comparator configured to compare the second input voltage with the first reference voltage to generate a second control signal;
   a first voltage regulator configured to be selectively enabled based on the first control signal and the second control signal, and configured to generate a first voltage based on the first input voltage, a level of the first voltage being substantially the same as the level of the second input voltage;
   an output terminal configured to output one of the second input voltage and the first voltage from the first voltage regulator as the power supply voltage;
   a first path configured to directly provide the first input voltage to the first voltage regulator; and
   a second path configured to directly provide the second input voltage to the output terminal, the second input voltage bypassing the first voltage regulator.

2. The semiconductor package of claim 1, wherein when the second input voltage is received at the second comparator and when the first input voltage is not received at the first comparator, the first voltage regulator is disabled, and the second input voltage is output as the power supply voltage via the second path to the output terminal, and wherein when the first input voltage is received at the first comparator and when the second input voltage is not received at the second comparator, the first voltage regulator is enabled and generates the first voltage based on the first input voltage provided via the first path, and the first voltage is output as the power supply voltage to the output terminal.

3. The semiconductor package of claim 2, wherein when both the first input voltage and the second input voltage are received respectively at the first comparator and the second comparator, the first voltage regulator is disabled, and the second input voltage is output as the power supply voltage via the second path to the output terminal.

4. The semiconductor package of claim 2, wherein when both the first input voltage and the second input voltage are received respectively at the first comparator and the second comparator, the first voltage regulator is enabled and generates the first voltage based on the first input voltage provided via the first path, and the first voltage is output as the power supply voltage to the output terminal.

5. The semiconductor package of claim 2, wherein a voltage level of the second input voltage and a voltage level of the first voltage are lower than the voltage level of the first input voltage.

6. The semiconductor package of claim 5, wherein a voltage level of the first reference voltage is lower than the voltage level of the first input voltage and is higher than the voltage level of the second input voltage.

7. The semiconductor package of claim 1, wherein the first voltage regulator is a low dropout (LDO) regulator.

8. The semiconductor package of claim 1,
wherein the first input voltage comprises a Universal Flash Storage (UFS) 2.0 power supply voltage and the second input voltage comprises a UFS 3.0 power supply voltage.

9. The semiconductor package of claim 1, further comprising:
a reference voltage generator configured to generate the first reference voltage;
a first input terminal configured to receive the first input voltage; and
a second input terminal configured to receive the second input voltage.

10. The semiconductor package of claim 1, further comprising:
a third comparator configured to compare the second input voltage with a second reference voltage to generate a third control signal;
a fourth comparator configured to compare a third input voltage with the second reference voltage to generate a fourth control signal, a voltage level of the third input voltage being different from a voltage level of the first input voltage and a voltage level of the second input voltage;
a second voltage regulator configured to be selectively enabled based on the third control signal and the fourth control signal, and configured to generate a second voltage based on the third input voltage, a voltage level of the second voltage being substantially the same as the voltage level of the second input voltage;
a third path configured to directly provide the third input voltage to the second voltage regulator.

11. The semiconductor package of claim 10, wherein the output terminal is configured to output one of the second input voltage, the first voltage from the first voltage regulator and the second voltage from the second voltage regulator as the power supply voltage.

12. The semiconductor package of claim 1, wherein the second path is formed in the first semiconductor chip.

13. The semiconductor package of claim 1, wherein the second path is formed in the base substrate.

14. The semiconductor package of claim 1, wherein the second semiconductor chip is disposed on the first semiconductor chip.

15. The semiconductor package of claim 1, wherein the second semiconductor chip is a memory chip including at least one nonvolatile memory device, and
wherein the first semiconductor chip is a controller chip that controls the at least one nonvolatile memory device.

16. A semiconductor package comprising:
a base substrate;
a first semiconductor chip on the base substrate, the first semiconductor chip comprising a power supply circuit configured to generate a power supply voltage based on at least one of a first input voltage and a second input voltage that are provided from an external device and have different voltage levels; and
a second semiconductor chip on the base substrate, the second semiconductor chip configured to operate based on the power supply voltage and the first input voltage,
wherein the power supply circuit comprises:
a first comparator configured to compare the first input voltage with a first reference voltage to generate a first control signal;
a second comparator configured to compare the second input voltage with the first reference voltage to generate a second control signal;
a voltage regulator configured to be selectively enabled based on the first control signal and the second control signal, and configured to generate a first voltage based on the first input voltage, a level of the first voltage being substantially the same as the level of the second input voltage;
an output terminal configured to output one of the second input voltage and the first voltage from the first voltage regulator as the power supply voltage,
wherein the base substrate comprises a wire which delivers a voltage level of the second input voltage to the second semiconductor chip, wherein the voltage level of the second input voltage is an operation voltage of the second semiconductor chip.

17. The semiconductor package of claim 16, wherein the base substrate comprises a printed circuit board.

18. The semiconductor package of claim 16, wherein the first input voltage and the second input voltage are power sources for the first semiconductor chip and/or the second semiconductor chip.

19. The semiconductor package of claim 18, wherein the first input voltage and the second input voltage are different voltage levels.

20. The semiconductor package of claim 16, the semiconductor package is at least one of an embedded multimedia card (eMMC), a universal flash storage (UFS), a solid state disc, a solid state drive (SSD) or a storage card.

* * * * *